US008627153B2

(12) United States Patent
Voicila et al.

(10) Patent No.: US 8,627,153 B2
(45) Date of Patent: Jan. 7, 2014

(54) METHOD AND DEVICE FOR ENCODING SYMBOLS WITH A CODE OF THE PARITY CHECK TYPE AND CORRESPONDING DECODING METHOD AND DEVICE

(75) Inventors: Adrian Voicila, Cergy (FR); David Declercq, Ableiges (FR); Marc Fossorier, Honolulu, HI (US); François Verdier, Le Pecq (FR); Pascal Urard, Theys (FR)

(73) Assignees: STMicroelectronics SA, Montrouge (FR); Centre National de la Recherche Scientifique (CNRS), Paris (FR)

( * ) Notice: Subject to any disclaimer, the term of this patent is extended or adjusted under 35 U.S.C. 154(b) by 455 days.

(21) Appl. No.: 12/676,802

(22) PCT Filed: Sep. 2, 2008

(86) PCT No.: PCT/FR2008/051558
§ 371 (c)(1),
(2), (4) Date: Apr. 19, 2011

(87) PCT Pub. No.: WO2009/044031
PCT Pub. Date: Apr. 9, 2009

(65) Prior Publication Data
US 2012/0173947 A1 Jul. 5, 2012

(30) Foreign Application Priority Data

Sep. 10, 2007 (FR) ...................................... 07 57457

(51) Int. Cl.
*H03M 1/18* (2006.01)
(52) U.S. Cl.
USPC .......................................................... 714/52

(58) Field of Classification Search
None
See application file for complete search history.

(56) References Cited

U.S. PATENT DOCUMENTS

| 2005/0229087 A1* | 10/2005 | Kim et al. | 714/800 |
|---|---|---|---|
| 2007/0283219 A1* | 12/2007 | Park et al. | 714/758 |
| 2011/0078533 A1* | 3/2011 | Zhou et al. | 714/752 |
| 2011/0252292 A1* | 10/2011 | Bose | 714/776 |

OTHER PUBLICATIONS

Voicila et al., "Architecture of a low-complexity non-binary LDPC decoder for high order fields", 2007, IEEE.*
Voicila et al., "Low-complexity, Low-memory EMS algorithm for non-binary LDPC codes", 2007, IEEE.*

(Continued)

*Primary Examiner* — Gabriel Chu
(74) *Attorney, Agent, or Firm* — Allen, Dyer, Doppelt, Milbrath & Gilchrist, P.A.

(57) ABSTRACT

A string of K initial symbols is encoded with a code of the parity check type. The K initial symbols belong to a Galois field of order q strictly greater than 2. The code is defined by code characteristics representable by a graph (GRH) comprising N−K first nodes ($NC_i$), each node satisfying a parity check equation defined on the Galois field of order q, N packets of intermediate nodes ($NIT_i$) and NI second nodes ($NSS_i$), each intermediate node being linked to a single first node and to several second nodes by way of a connection scheme. The string of K initial symbols is encoded by using the said code characteristics and a string of N encoded symbols is obtained, respectively subdivided into NI sub-symbols belonging respectively to mathematical sets whose orders are less than q, according to a subdivision scheme representative of the connection scheme (Π).

39 Claims, 14 Drawing Sheets

(56) References Cited

OTHER PUBLICATIONS

Grimnell, et al. "Efficient Message Passing Decoding Using Vector-based Messages", 2005, Linkoping University, Department of Electrical Engineering, Institutionen för systemteknik [http://urn.kb.se/resolve?urn=urn:nbn:se:liu:diva-5205].*

Declercq et al. *Decoding Algorithms for Nonbinary LDPC Codes Over GF(q)* IEEE Transactions on Communications. vol. 55. No. 4. Apr. 2007.

Declercq et al, "Decoding Algorithms for Nonbinary LDPC Codes Over GF(q) IEEE Transactions on Communications", vol. 55. No. 4., Apr. 2007, pp. 633-643.

Poulliat et al, "Using Binary images of non binary LDPC codes to improve overall performance", no date available, pp. 1-6.

Poulliat, "Ecole doctorale sciences et ingénierie de l'universitéde Cergy-Pontoise—Thèse—Spécialité: Traitement des Images et du Signal : Allocation et optimisation de ressources pour la transmission de données multimedia", Oct. 2001, pp. 1-77.

* cited by examiner

METHOD AND DEVICE FOR ENCODING SYMBOLS WITH A CODE OF THE PARITY CHECK TYPE AND CORRESPONDING DECODING METHOD AND DEVICE

FIELD OF THE INVENTION

The invention relates to codes of the parity check type having characteristics that can be represented by a low density matrix, with low density corresponding to a low number of nonzero values.

BACKGROUND OF THE INVENTION

Parity check codes can be considered as codes having low density and parity checking. The person skilled in the art is aware of examples of such codes under the name LDPC (Low Density Parity Check) codes.

LDPC codes were introduced by Gallager in 1962 and rediscovered in 1996 by MacKay and Niel. These codes play a fundamental role in modern communications, and in particular, because of their very good error correcting performance.

The LDPC codes generally used are binary LDPC codes. That is, they are defined on a Galois field of order 2. The word field is understood to mean in the mathematical sense, and it is recalled that a Galois field is a field containing a finite number of elements. A binary LDPC code defined on a Galois field of order 2 comprises symbols capable of taking just two values, for example, the values 0 or 1.

From a theoretical viewpoint, non-binary LDPC codes are additionally known. They are defined on a Galois field of order strictly greater than 2, for example, equal to an integer power of 2 strictly greater than 1.

These non-binary LDPC codes are beneficial since their performance in terms of error correction can be increased significantly with respect to binary LDPC codes. These binary LDPC codes are more robust, and in particular, with strings of symbols to be encoded of small sizes.

The performance gain obtained with non-binary LDPC codes is accompanied by a significant increase in the decoding complexity as well as the memory size necessary for the decoder. Specifically, for example, for an LDPC code defined in a Galois field of order $2^p$, it is necessary to store messages of size $2^p$ and, at the present time, this problem has not been adequately addressed.

SUMMARY OF THE INVENTION

In view of the foregoing background, an object of the present invention is to provide a mode of implementing a coding of symbols defined on a Galois field of order q that is strictly greater than 2. Associated decoding allows a decoder to have a reduced memory size.

The symbols defined in the Galois field of order q, with q being strictly greater than 2, may be projected into a string of equivalent symbols or sub-symbols, belonging to mathematical sets of an order less than q. These mathematical sets may be, in particular, example fields but more generally, any mathematical structure such as groups or rings, furnished with the addition operator.

A code of the parity check type may be formulated, and defined by code characteristics represented by a graph comprising check nodes each satisfying a parity check equation. A graph of a conventional non-binary LDPC code may comprise check nodes and symbol nodes. All these nodes may be defined on a Galois field of order q strictly greater than 2, and the symbol nodes may exhibit a first link connectivity in relation to the check nodes while the check nodes exhibit a second link connectivity in relation to the symbol nodes. With respect to such a graph, the symbol nodes may be subdivided into sub-symbol nodes (equivalent symbols) respectively defined on mathematical sets of orders less than q. The symbol nodes may be replaced with packets of intermediate nodes, and each intermediate node may be linked to a single check node while preserving the connectivity of the check nodes in relation to the intermediate nodes while each intermediate node is linked to several sub-symbol nodes by a connection scheme while transferring the first connectivity to the level of the sub-symbol nodes.

A totally new code structure may then be obtained which cannot be considered to be a non-binary LDPC code although, as will be seen in greater detail hereafter, the decoder nevertheless may use local recombinations of sub-symbols to decode locally in the Galois field of order q but while updating the sub-symbol nodes in the sets of orders less than q.

According to one aspect, a method of encoding a string of K initial symbols with a code of the parity check type is provided. The K initial symbols may belong to a Galois field of order q strictly greater than 2. The code may be defined by code characteristics represented by a graph comprising N−K first nodes, designated by the name of check nodes, for example. Each first node may satisfy a parity check equation defined on the Galois field of order q.

The graph may additionally comprise N packets of intermediate nodes and NI second nodes, for example, which are also referred to as sub-symbol nodes. Each intermediate node may be linked to a single first node and to several second nodes by a connection scheme.

The string of K initial symbols may be encoded by using the code characteristics and a string of N encoded symbols is obtained. The string may be subdivided into NI sub-symbols belonging respectively to mathematical sets whose orders are less than q, according to a subdivision scheme representative of the connection scheme.

Although it is advantageous to simplify the process, for each symbol to be subdivided into the same number of sub-symbols, it is possible for this subdivision to be irregular. That is, the number of sub-symbols may be different from one symbol to another. Likewise, when the mathematical sets having an order less than q all exhibit the same order, it is not excluded that these mathematical sets can exhibit different orders.

By way of example, when q is equal to $2^p$, with p strictly greater than 1, each order less than q can also be an integer power of 2, and for example, equal to $2^{p/ns}$. In this case, NI is equal to the product of ns times N.

The N packets of intermediate nodes may be respectively associated with the N encoded symbols. The subdivision scheme may comprise, for each encoded symbol, the number and the locations of the corresponding sub-symbols within the string. This number and these locations are representative of the part of the connection scheme ending up at the packet of intermediate nodes associated with the encoded symbol.

The variable q may be equal to $2^p$, with p strictly greater than 1, and each order less than q is also an integer power of 2. The definition of the code characteristics may comprise forming a first matrix possessing N−K groups of p rows respectively associated with the N−K parity check equations, and N groups of p columns respectively associated with the N symbols. Each group of p rows may comprise bit blocks of p rows and of p columns forming respectively binary matrix images of the nonzero coefficients of the parity check equation associated with the d group of p rows considered. Each of these blocks, associated with a symbol, may be subdivided into j bit sub-blocks of p rows and of $p_i$ columns respectively situated at different locations on the group of p rows. For the values of the numbers j and $p_i$, i varies from 1 to j. The subdivision may also be the positions of the various locations of the sub-blocks forming a block associated with an encoded symbol may be representative of part of the subdivision scheme associated with the encoded symbol. The string of encoded symbols may be obtained on the basis of the first matrix and of the string of initial symbols.

Thus, by way of example, the obtaining of the string of encoded symbols can comprise a diagonalization of the first matrix so as to obtain a second matrix (also called the generating matrix) and a multiplication of the second matrix with the string of initial symbols.

As a variation, the obtaining of the string of encoded symbols may comprise a triangularization of the first matrix so as to obtain a second matrix and a recursive calculation of the redundancy sub-symbols using the second matrix and the string of initial symbols.

Forming the first matrix may comprise forming an initial matrix comprising a first part representative of the parity check equations, and a second part containing various grouping indications respectively representative of the subdivision scheme. The forming may further comprise a determination of the first matrix on the basis of the initial matrix. The initial matrix is not a parity matrix within the conventional sense of the term but makes it possible to completely describe the code structure, and in particular, to provide in an especially straightforward manner, an indication representative of the symbols subdivision scheme.

More precisely, for example, the first part of the initial matrix may comprises N–K rows whose elements, belonging to the Galois field of order q, may represent the coefficients of the various parity check equations. The second part of the initial matrix may comprise NI rows respectively associated with the NI second nodes, and whose elements form the various grouping indications. The first part and the second part of the initial matrix may have the same number of columns, with this number being equal to the number of intermediate nodes.

It is particularly advantageous to form the second part of the initial matrix so as to obtain for the initial matrix taken in its entirety, a graph radius greater than or equal to a desired threshold. It is recalled that a graph radius, according to terminology well known to the person skilled in the art, corresponds to the minimum cycle of the graph representing the code. A cycle represents the path along the links of the graph which starts from an arbitrary node and which returns to the same node.

Having as large a graph radius as possible makes it possible to further improve the performance of the decoding in terms of error correction. Thus, it will be possible to choose, for example, a desired threshold equal to 6.

With reference to the decoding, it may be preferable to also provide an indication representative of the symbols subdivision scheme. Such an indication is not indispensable since it is always possible, by using an appropriate algorithm, to determine at the level of the decoder all the possible subdivisions used in the encoded block until the binary images of the symbols are identified.

This indication representative of the symbols subdivision scheme can take any appropriate form, but a particularly simple representation thereof is the initial matrix.

Another aspect is directed to an encoding device comprising an input for receiving a string of K initial symbols belonging to a Galois field of order q strictly greater than 2, and a storage means or storage device (i.e., a memory) for storing code characteristics represented by a graph comprising N–K first nodes. Each first node may satisfy a parity check equation defined on the Galois field of order q, N packets of intermediate nodes and NI second nodes. Each intermediate node may be linked to a single first check node and to several second nodes by a connection scheme. Encoding means or an encoder may be coupled to the input and to the storage to form a string of N encoded symbols respectively subdivided into NI sub-symbols belonging respectively to mathematical sets whose orders are less than q, according to a subdivision scheme representative of the connection scheme.

The variable q may be equal to $2^p$, with p greater than 1, and each order less than q may also be an integer power of 2. The device may further comprise processing means or a processor to form a first matrix also representative of the code characteristics. This first matrix possesses N–K groups of p rows respectively associated with the N–K parity check equations, and N groups of p columns respectively associated with the N symbols. Each group of p rows may comprise bit blocks of p rows and of p columns forming respectively binary matrix images of the nonzero coefficients of the parity check equation associated with the group of p rows considered. Each of these blocks, associated with an encoded symbol, may be subdivided into j bit sub-blocks of p rows and of $p_i$ columns respectively situated at different locations on the group of p rows. For the values of the numbers j and $p_i$, i varies from 1 to j. The subdivision may also be the positions of the various locations of the sub-blocks forming a block associated with an encoded symbol being representative of part of the subdivision scheme associated with the encoded symbol. The encoder may be able to form the string of encoded symbols on the basis of the first matrix.

Processing means or a processor may further form an initial matrix comprising a first part representative of the parity check equations and a second part containing various grouping indications respectively representative of the subdivision scheme. The first matrix may be determined on the basis of the initial matrix.

Another aspect is directed to a method for decoding a string of encoded symbols, in which each symbol has been encoded with a code of the parity check type defined by code characteristics represented by a graph comprising first nodes each satisfying a parity equation, second nodes and intermediate nodes. Each intermediate node may be linked to a single first node and to several second nodes by a connection scheme. Each encoded symbol of the string may belong to a Galois field of order q strictly greater than 2, and may be subdivided into sub-symbols belonging respectively to mathematical sets of orders less than q, according to a subdivision scheme representative of the connection scheme. An iterative update of the first nodes in the Galois field of order q may be performed while an iterative update of the second nodes in the mathematical sets of orders less than q is performed, taking account of the subdivision scheme.

The iterative update of the various nodes may be performed in a parallel manner. That is, to an iterative update of all the second nodes then an update of all the first nodes. It may be more advantageous to perform a sequential update of the first nodes and of the nodes situated in the neighbourhood of an updated first node.

The method may also comprise processing the intermediate nodes distributed before and after an update of the first nodes. More precisely, for example, the processing of the intermediate nodes may comprise a first recombination subprocessing performed before an update of a first node, then a second sub-processing or marginalization processing performed after the update of the first node.

It is possible, for example, to perform an update of the nodes using an algorithm of the belief propagation type (BP algorithm). For the decoding, it is possible, for example, to store in matrix form the code characteristics corresponding to the graph.

Thus, this storage in matrix form may comprise, for example, the various coefficients of the parity equations as well as the information representative of the scheme for subdividing the symbols into sub-symbols within the string.

Another aspect is directed to a decoding device comprising an input for receiving a string of symbols encoded with a code of the parity check type, with each encoded symbol of the string belonging to a Galois field of order q strictly greater than 2 and subdivided into sub-symbols belonging respectively to mathematical sets of orders less than q, according to a subdivision scheme. The device may further comprise storage means or a storage device (i.e., a memory) to store characteristics of the code that may be represented by a graph comprising first nodes each satisfying a parity equation, second nodes and intermediate nodes. Each intermediate node may be linked to a single first node and to several second nodes by a connection scheme representative of the subdivision scheme. Decoding means or a decoder coupled to the input and to the storage device may be configured to perform an iterative update of the first nodes in the Galois field of order q, and to perform an iterative update of the second nodes in the mathematical sets of orders less than q, taking account of the subdivision scheme.

The decoding device may also be to process the intermediate nodes that is distributed before and after an update of the first nodes. The decoding device may also update in a sequential manner the various first nodes and the nodes situated in the neighborhood of each updated first node. The decoding device may also be able to implement an algorithm of the belief propagation type.

The storage device may also store in matrix form the code characteristics corresponding to the graph. The matrix may contain the various coefficients of the parity equations as well as information representative of the scheme for subdividing the symbols into sub-symbols within the string. The matrix may comprise a first part representative of the parity check equations and a second part containing various grouping indications respectively representative of the subdivisions of the various encoded symbols.

The first part of the matrix comprises N−K rows whose elements belonging to the Galois field of order q may be representative of the coefficients of the various parity check equations, and the second part of the matrix may comprise NI rows, respectively associated with the NI second nodes, whose elements form the various grouping indications. The first part and the second part of the matrix may have the same number of columns. This number may be equal to the number of intermediate nodes. The input is configured to receive a string of N encoded symbols, and the decoding device may deliver a string of K symbols decoded on the basis of the matrix and of the string of N symbols.

According to another aspect, a communication facility may be coupled to a transmission channel. The communication facility may comprise an encoding device as defined above, and may comprise decoding device as defined above.

BRIEF DESCRIPTION OF THE DRAWINGS

Other advantages and characteristics of the invention will be apparent on examining the detailed description of non-limiting embodiments and modes of implementation, and the appended drawings in which.

DETAILED DESCRIPTION OF THE PREFERRED EMBODIMENTS

Figure 1:
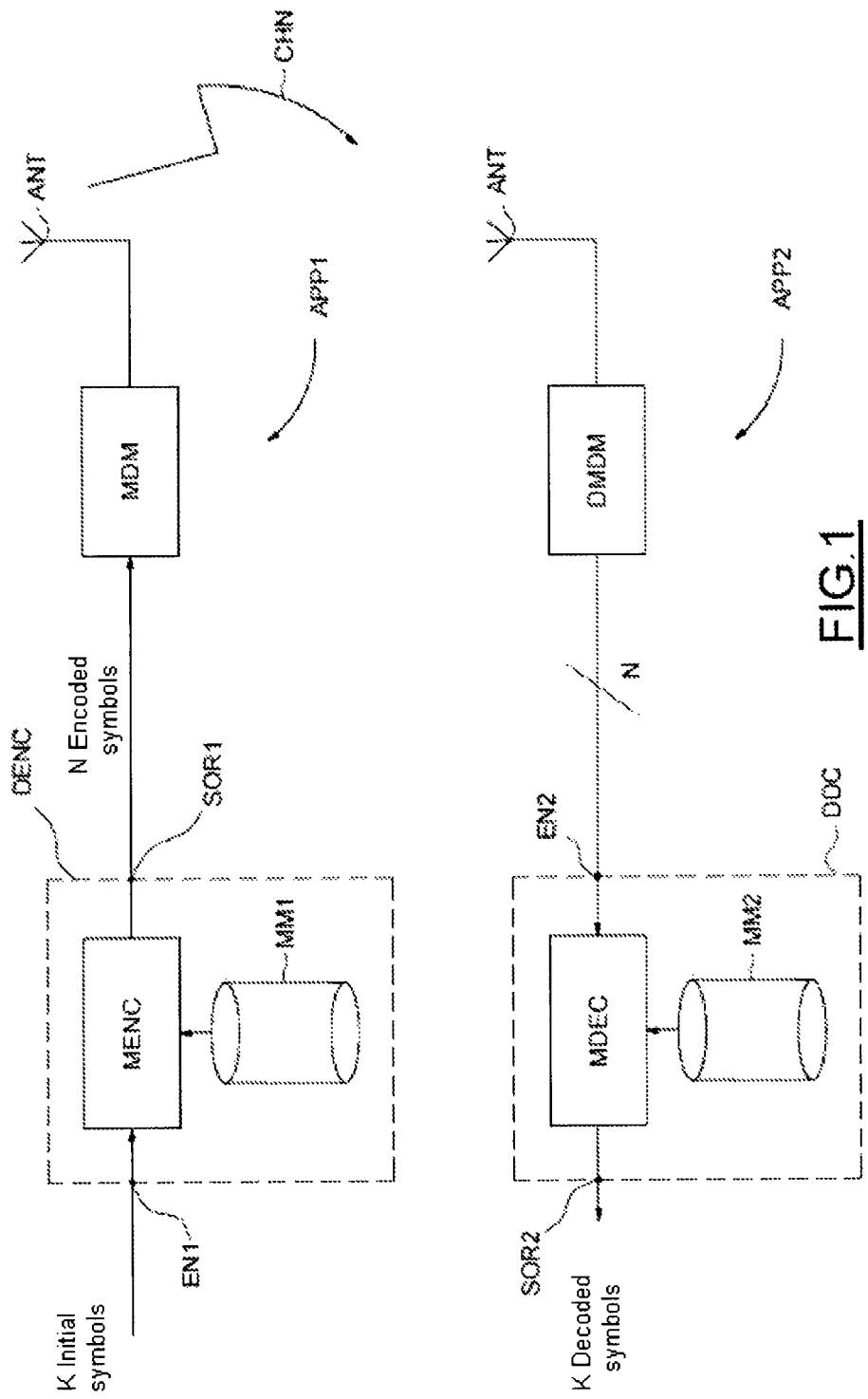
FIG. 1 is a schematic diagram of a communication facility comprising an encoding device and a decoding device in accordance with the present invention.

In FIG. 1, the reference APP1 denotes a transmission facility, for example, a wireless facility belonging to a wireless communication system. However, the invention is not limited to this type of application, and encompasses numerous applications such as transmission facilities capable of exchanging information via optical fibers or modems, for example.

In a more general manner, the invention finds a particularly advantageous application in transmissions at very high throughput as well as in applications of magnetic recording such as, for example, hard disks for the purpose of replacing, in particular, the currently used codes of the Reed-Solomon type.

The facility APP1 comprises an encoding device DENC having an input EN1 capable of receiving successive strings of K initial symbols to deliver at the output SOR1 successive strings of N encoded symbols, which are in fact subdivided symbols as will be seen in greater detail hereafter.

To perform this coding, the device DENC comprises encoding means or an encoder MENC coupled between the input EN1 and the output SOR1, and using code characteristics stored in storage means or a storage device MM1, which may be a memory, for example.

In the example described here, the send chain of the facility APP1 also comprises modulation means or a modulator to implement any type of modulation. For example, a modulation of the M-PSK type or a modulation of the M-QAM type may be implemented. These modulation types are well known to the person skilled in the art.

The information is thereafter transmitted on a communication channel CHN, which in the illustrated embodiment is air, by way of an antenna ANT. The reference APP2 denotes a reception facility comprising a receive chain possessing an antenna ANT.

Demodulation means or a demodulator DNDM, of conventional structure, performs demodulation and delivers in particular N items of information that includes probability information. Additionally, as will be seen in greater detail hereafter, each item of information is in fact a vector.

These N items of information, which correspond to the N encoded symbols that have been transmitted, are delivered to the input EN2 of a decoding device DDC. This decoding device DDC comprises decoding means or a decoder MDEC using the same code characteristics as those used for the coding. These code characteristics are also stored in storage means or a storage device MM2, which may be a memory, for example.

The output SOR2 of the decoder provides an estimation of the K decoded symbols. Each symbol of each string of K initial symbols is a symbol defined on a Galois field of order q, indicated as GF(q) (according to terminology customarily used by the person skilled in the art) with q strictly greater than 2.

Therefore, each initial symbol is capable of taking q values. Subsequently in the text, and although the invention is not limited thereto, it will be considered that q is equal to $2^p$ with p strictly greater than 1. In this case, each symbol can be represented by a set of p bits, with each of these bits being able to take the values 0 or 1.

Figure 2:
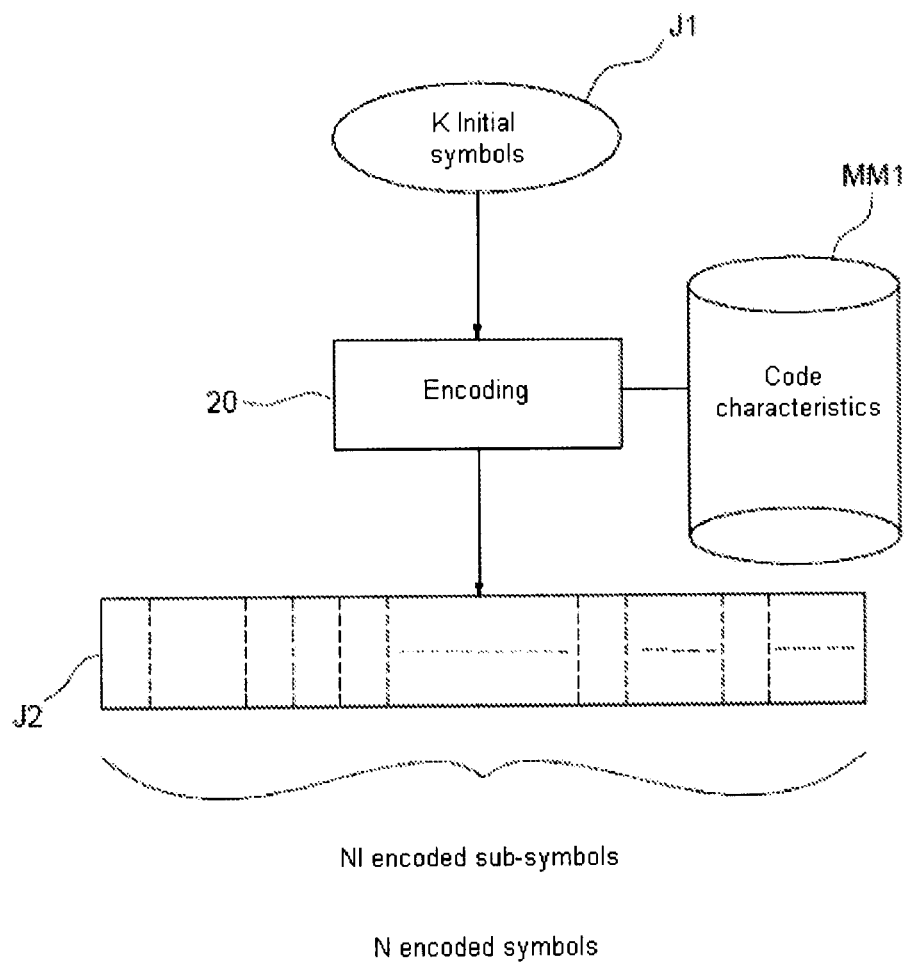
FIG. 2 is a schematic diagram illustrating a mode of implementation of an encoding using an exemplary subdivided-code structure in accordance with the present invention.

As illustrated in FIG. 2, a string J1 of K initial symbols is encoded (step 20) by using the code characteristics contained in the memory MM1, and a string J2 of N encoded symbols is delivered. Each of these N encoded symbols is also defined on the Galois field GF(q) but is subdivided into sub-symbols. Therefore, this string J2 is composed of NI encoded sub-symbols.

Each of the sub-symbols is defined on a mathematical set which, in the described example, is also a field having an order less than q. Additionally, the number of sub-symbols forming an encoded symbol can be different or identical for each symbol. Likewise, the size of the sub-symbols can be different depending on the symbols.

For purposes of simplifying the illustration, it will now be assumed that the encoded sub-symbols are all defined on the same mathematical set, for example, a field having the same order less than q.

More particularly, it will be assumed in what follows that each encoded symbol is subdivided into ns sub-symbols. Therefore, each sub-symbol is consequently defined on the Galois field GF ($2^{p/ns}$).

The string J2 of N encoded symbols comprises NI encoded sub-symbols, with NI being equal to the product of ns times N. Such a code structure will subsequently be dubbed "code structure with subdivided symbol" or more simply "subdivided-code structure".

Figure 3:
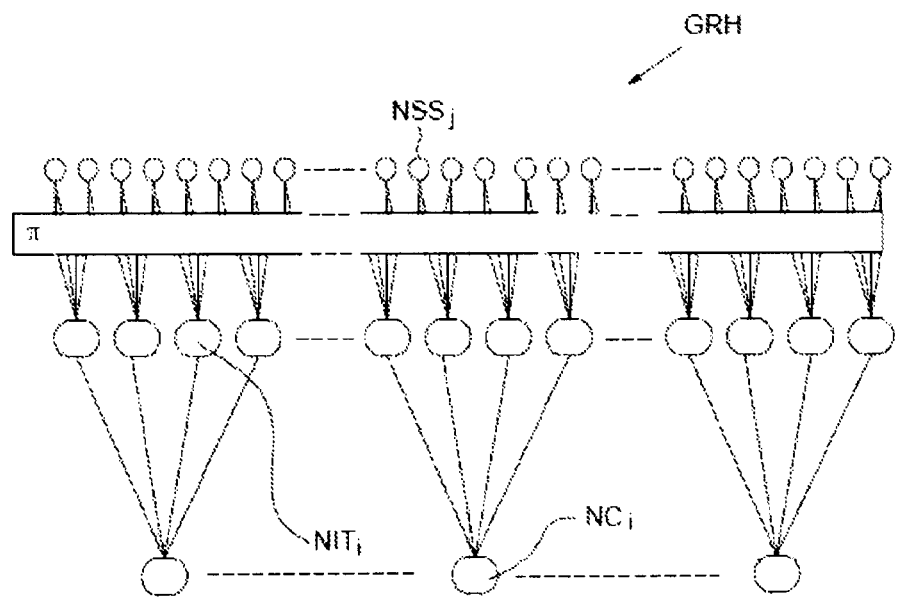
FIGS. 3 and 4 illustrate examples of graphs relating to subdivided-code structures in accordance with the present invention.

If FIG. 3, for which ns=4, is now more particularly referred to since a subdivided-code structure such as this exhibits code characteristics which can be represented by a graph GRH comprising M=N-K first nodes $NC_i$, also dubbed "check node" according to terminology commonly used by the person skilled in the art. Each of these first nodes satisfies a parity check equation which is defined on the Galois field of order q, and which will be returned to in greater detail hereafter.

The graph GRH also comprises NI second nodes also called "sub-symbol nodes" $NSS_j$. Additionally, the graph comprises N packets of intermediate nodes $NIT_i$. The N packets of intermediate nodes are respectively associated with the N encoded symbols.

Each intermediate node is linked to a single check node and to several sub-symbol nodes by a connection scheme as indicated by reference Π. The string J2 of N encoded symbols is subdivided into NI symbols according to a subdivision scheme which is representative of the connection scheme Π.

The subdivision scheme comprises, for each encoded symbol, the number and the locations of the corresponding sub-symbols within the J2. This number and these locations are representative of the part of the connection scheme ending up at the packet of intermediate nodes that is associated with the encoded symbol.

Figure 4:
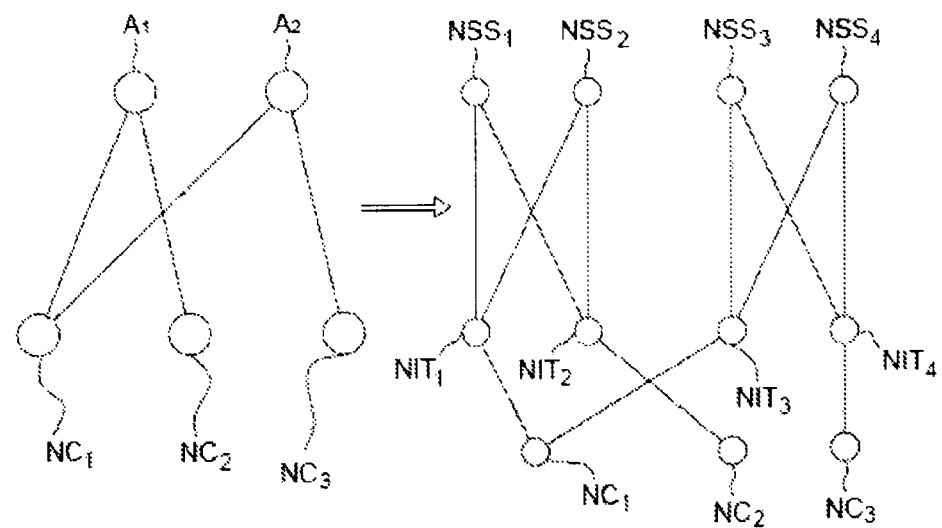

The left part of FIG. 4 represents a part of a graph of a conventional non-binary LDDC code on GF(q) comprising check nodes (here 3) $NC_1$-$NC_3$ and two symbol nodes $A_1$ and $A_2$ defined on GF(q). It is seen in this graph part that each symbol node $A_1$ and $A_2$ exhibits a connectivity of degree 2 in relation to the check nodes.

A characteristic of the illustrated embodiment, which includes projecting or transforming symbol nodes into sub-symbol nodes defined on a Galois field of order less than q, results in a modification of the graph such as, for example, as illustrated in the right part of FIG. 4. It is seen in this right part that the symbol nodes are deleted and, if it is assumed that each symbol is subdivided into two sub-symbols, four sub-symbol nodes $NS_1$-$NS_4$ are actually obtained.

The symbol node $A_1$ is subdivided into the sub-symbol nodes $NSS_1$ and $NSS_2$ while the symbol node $A_2$ is subdivided into sub-symbol nodes $NSS_3$ and $NSS_4$. In regards to the intermediate nodes, they are each linked to a single check node. On the other hand, as the symbol $A_1$ is linked to the check nodes $NC_1$ and $NC_2$, it is necessary to associate with it the two intermediate nodes $NIT_1$ and $NIT_2$ that will be respectively connected to the check nodes $NC_1$ and $NC_2$.

Likewise, since the symbol $A_2$ is connected to the two check nodes $NC_1$ and $NC_3$, and as each intermediate node can be connected to only a single check node, it is necessary to associate with the symbol node $A_2$ the two intermediate nodes $NIT_3$ and $NIT_4$ that will be respectively connected to the check nodes $NC_1$ and $NC_3$. On the other hand, the connectivity is charted of the symbol nodes at the level of the sub-symbol nodes as illustrated in the right part of FIG. 4.

Figure 5:
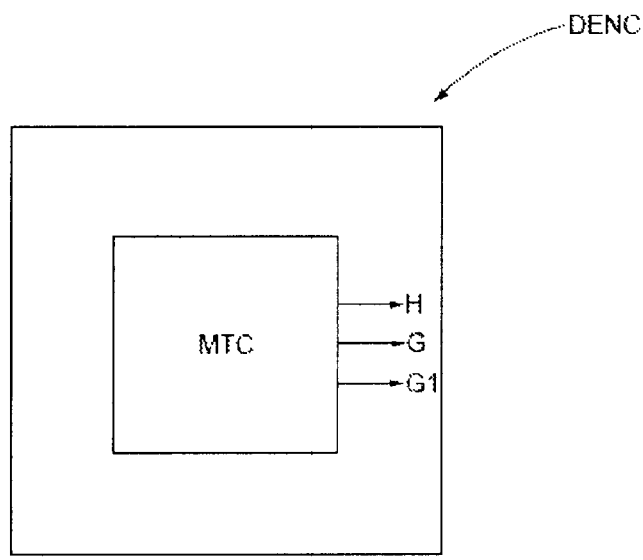

The code characteristics, which are represented by a graph, can also be represented in matrix form. In this regard, as illustrated in FIG. 5, it is envisioned that the encoding device DENC comprises processing means or a processor NTC capable of forming a matrix H, for example, on the basis of which it will be possible to determine each string J2 of encoded symbols.

It is known that for a non-binary LDPC code defined on GF(q) with q=$2^p$, each nonzero coefficient of a parity check equation can be represented in the form of a block of bits of p rows and of p columns, thus forming the binary matrix image of this coefficient. The person skilled in the art will be able to refer for all useful purposes to the article by C. Poulliat, M. Fossorier and D. Declercq, "Design of non-binary LDPC codes using their binary image: algebraic properties", in the proc. of ISIT'06, Seattle, USA, July 2006. Each matrix block of p×p bits, referenced $H_k$ (FIG. 6) is associated with a symbol.

Figure 6:
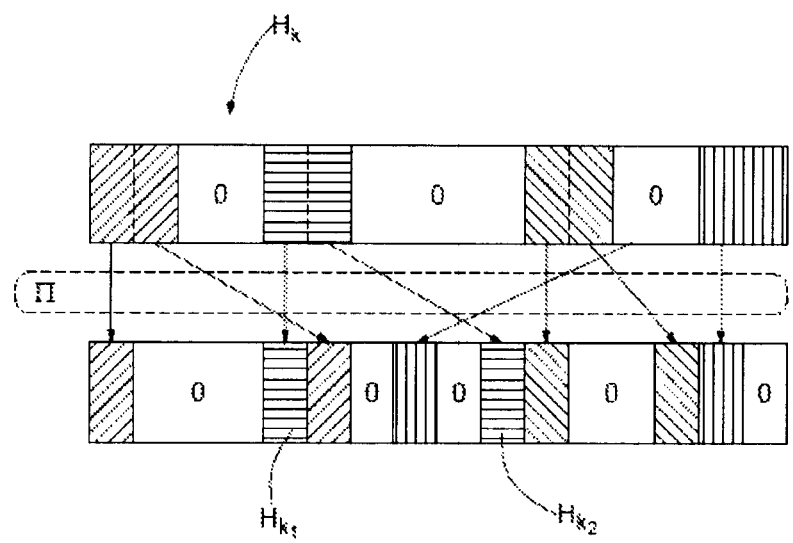
FIGS. 5 to 12 are schematic diagrams illustrating examples of constructing code characteristics, in particular in matrix form, relating to a subdivided-code structure in accordance with the present invention.

The subdivision of the symbols into sub-symbols results, as illustrated in FIG. 6, in a subdivision of the block $H_k$ into j sub-blocks (j is equal to two since each symbol is assumed to be subdivided into two sub-symbols). Each sub-block of bits comprises p rows and a number $p_i$ of columns equal to the size of the sub-symbol (i=1, . . . j).

In the present case, since it is assumed that all the symbols are subdivided into two sub-symbols, the number $p_i$ of columns of each sub-block is identical. On the other hand, the positions of the various locations of the sub-blocks forming a block associated with an encoded symbol are representative of the part of the subdivision scheme associated with the encoded symbol.

Figure 7:
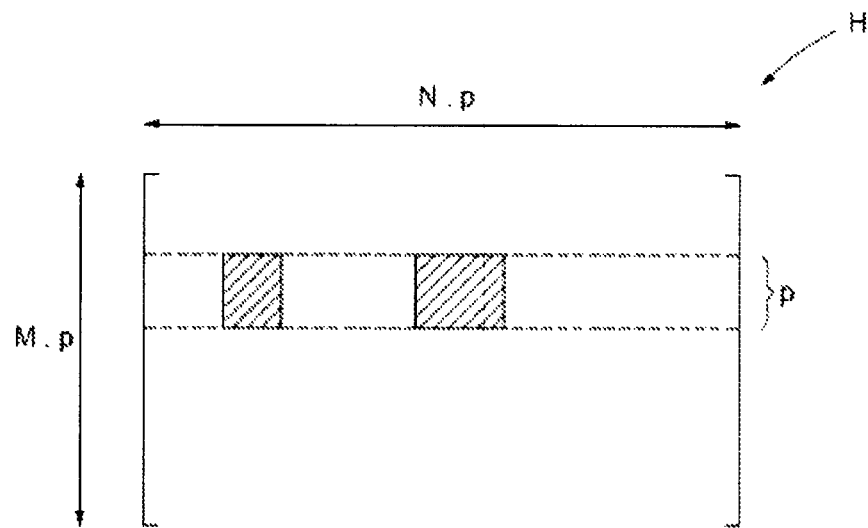

In the example of FIG. 6, the block $H_k$ is subdivided into two sub-blocks $H_{k_1}$ and $H_{k_2}$. Thus, as illustrated in FIG. 7, this matrix H, also dubbed first matrix, comprises M groups of p rows respectively associated with the M parity check equations (M is equal to N-K) and N groups of p columns respectively associated with the N encoded symbols.

Each group of p rows comprises the bit blocks of p rows and of p columns forming the binary matrix images of the nonzero coefficients of the parity check equation associated with the groups of p rows considered. Each of these blocks is subdivided into j sub-blocks as indicated above. The values of the numbers j as well as the values $P_i$ (i=1 to j) of the number of the columns of the sub-blocks, and the positions of the various locations of the sub-blocks forming a block associated with an encoded symbol are representative of the part of the subdivision scheme associated with this encoded symbol.

Thus, while a parity check equation of degree $d_{c-1}$ in a GF(q) conventional non-binary LDPC code is defined by the formula below:

$$\sum_{k=0}^{d_c-1} h_k A_k = 0$$

in which $A_k$ denotes a symbol in GF(q), and $h_k$ denotes a nonzero coefficient of the parity check equation (also in GF(q)), this parity check equation can be written in the case of a subdivided-code structure in matrix form through the formula below:

$$\sum_{k=0}^{d_c-1} \sum_{i=1}^{n_s} H_{k_i} SS_{k_i} = 0$$

in which $SS_{k_1}$ denotes a sub-symbol, and ns the number of sub-symbols (assumed constant and identical) forming a symbol.

Regardless of the way the symbols are subdivided into sub-symbols, that is, regardless of the locations of the various sub-blocks within the various groups of p rows, a code structure of the subdivided type will always be obtained which will make it possible to obtain symbols encoded on Galois fields of order less than q. This also makes it possible, during decoding, to reduce the memory size necessary for decoding since the size of the sub-symbols which will have to be stored will have been reduced.

As will be seen in greater detail hereafter, an appropriate subdivision scheme, leading to appropriate locations of the sub-blocks within the matrix H, will make it possible to improve the performance of the coding and decoding, in terms of error correction in particular.

Figure 8:
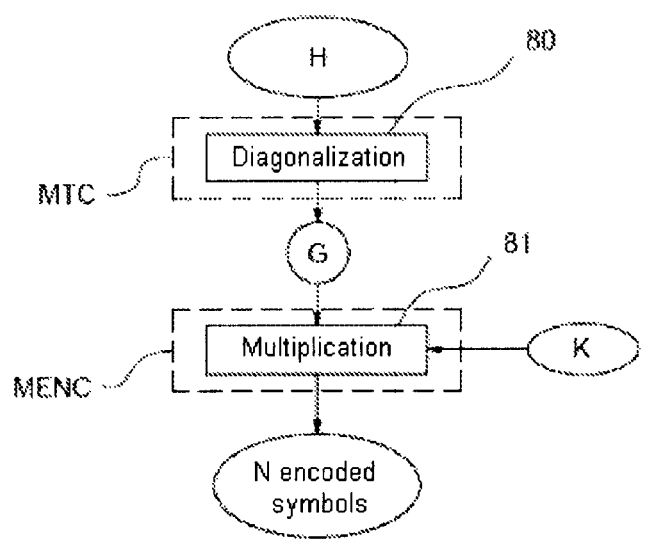

On the basis of the matrix H, the processing means or the processor MTC can perform, for example, a diagonalization processing 80 (FIG. 8), which is well known to the person skilled in the art, to obtain a matrix G termed the generating matrix which will allow the formulation of the encoded symbols. Specifically, the encoding means or the encoder MENC will form the string J2 of N encoded symbols (FIG. 8) by multiplying (step 81) the string of K initial symbols with the generating matrix G.

Figure 9:
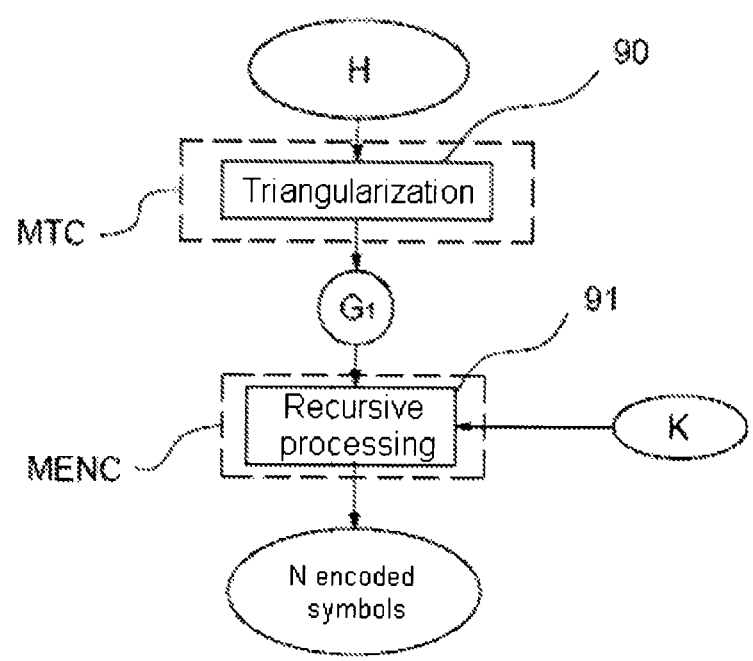

Another approach, illustrated in FIG. 9, includes performing a triangularization processing (step 90, FIG. 9) of the matrix H to obtain a matrix G1 and then to perform, in a conventional manner, a recursive calculation (step 91) of the redundancy sub-symbols by using the matrix G1 and the string of K initial symbols to obtain the N encoded symbols.

Figure 11:
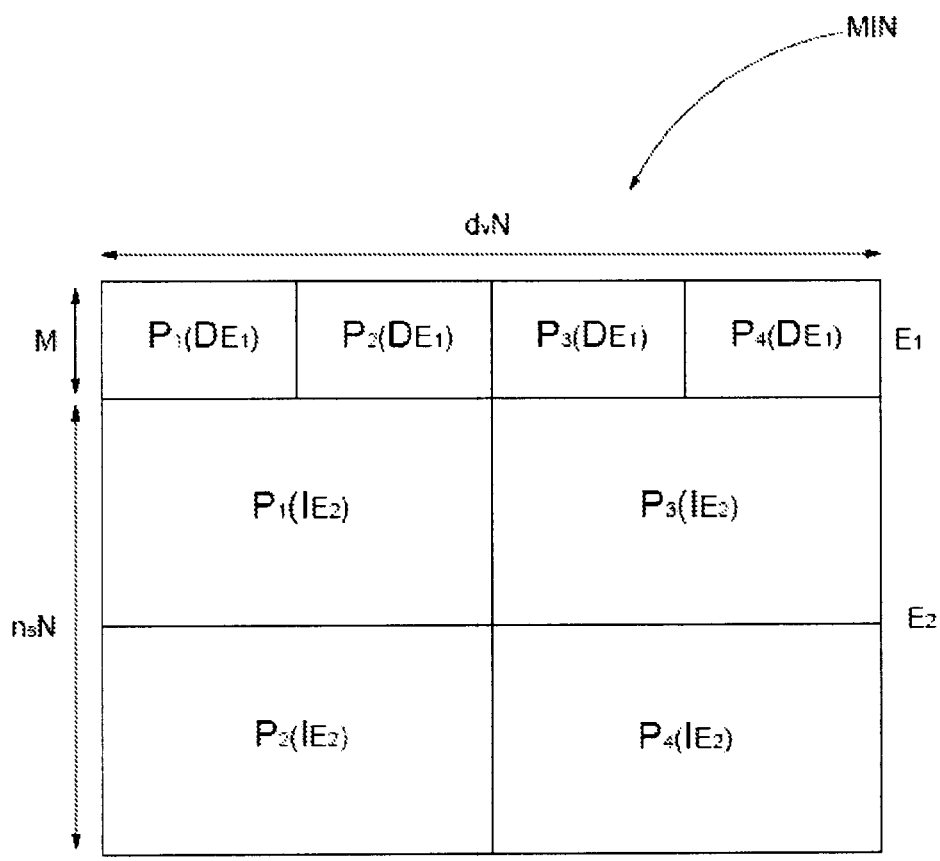

Another way of representing the code characteristics includes forming an initial matrix MIN, such as that illustrated in FIG. 11 for a particular case. Such an initial matrix MIN comprises, as will be seen hereafter, a first part representative of the parity check equations and a second part containing various grouping indications respectively representative of the subdivision scheme.

Figure 10:
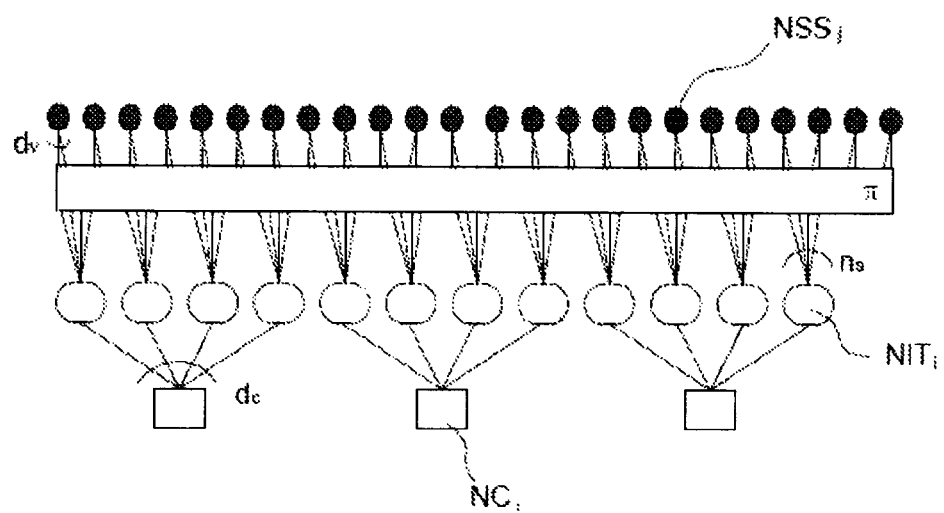

To more precisely describe the structure of the matrix MIN illustrated in FIG. 11, it is assumed that a subdivided-structure code graph of the type of that of FIG. 10 is present. As illustrated in FIG. 10 there is a degree of connection of the check nodes equal to $d_c$ and a degree of connection of the sub-symbol nodes $NSS_j$ equal to $d_v$.

Additionally, it is assumed that each encoded symbol is subdivided into $n_s$ equivalent symbols or sub-symbols. Additionally, in this example it is considered that $d_v$ is equal to $n_s$ and (these two values being equal to 2) that $d_c$ is equal to 4.

The first part E1 of the initial matrix MIN comprises M=N−K rows whose elements, belonging to the Galois field of order $2^p$, are representative of the coefficients of the various parity check equations. The first part E1 of the matrix MIN corresponds to the profile of the check nodes. The second part E2 of the matrix MIN comprises a number of rows equal to the number of sub-symbols, in this instance N times ns.

Each of the rows is associated with a sub-symbol and the elements of the second part E2 of the matrix MIN form the various grouping indications. Additionally, the matrix MIN possesses a number of columns equal to the number of intermediate nodes, in this instance $Nd_v$.

As indicated above, the elements of the second part E2 of the matrix MIN form the various grouping indications making it possible to form the symbols from the sub-symbols. In this regard, a logic value equal to 1, for example, at the intersection of a row and of a column of the second part E2 of the matrix MIN, signifies that the corresponding sub-symbol is linked to the corresponding intermediate node.

The connection of the intermediate nodes to the check nodes is defined by the first part E1 of the matrix MIN. Additionally, in FIG. 11, $D_{E_1}$ denotes the diagonal matrix of size M×M. $I_{E_2}$ denotes the identity matrix of size N×N. $P_i$ denotes a circular permutation.

It is therefore seen that the matrices E1 and E2 are constructed by using a construction based on a circular permutation. Stated otherwise, $P_i(I_{E_2})$ for i=1 to 4, is a matrix resulting from a circular permutation of the matrix $I_{E_2}$.

It should be noted that this matrix MTN is not a parity matrix within the conventional sense of the term, but makes it possible to completely describe the subdivided code structure. The advantage of such a construction of an initial matrix resides in the simplicity of the construction, and also in the obtaining of good properties of the graph radius.

It is recalled here that the graph radius is the minimum path within the graph starting from an arbitrary symbol and returning to this same symbol. By choosing to place the nonzero elements of the second part E2 of the initial matrix MIN in an appropriate manner (FIG. 12), it is possible to obtain cycles whose minimum value is greater than a desired threshold.

Figure 12:
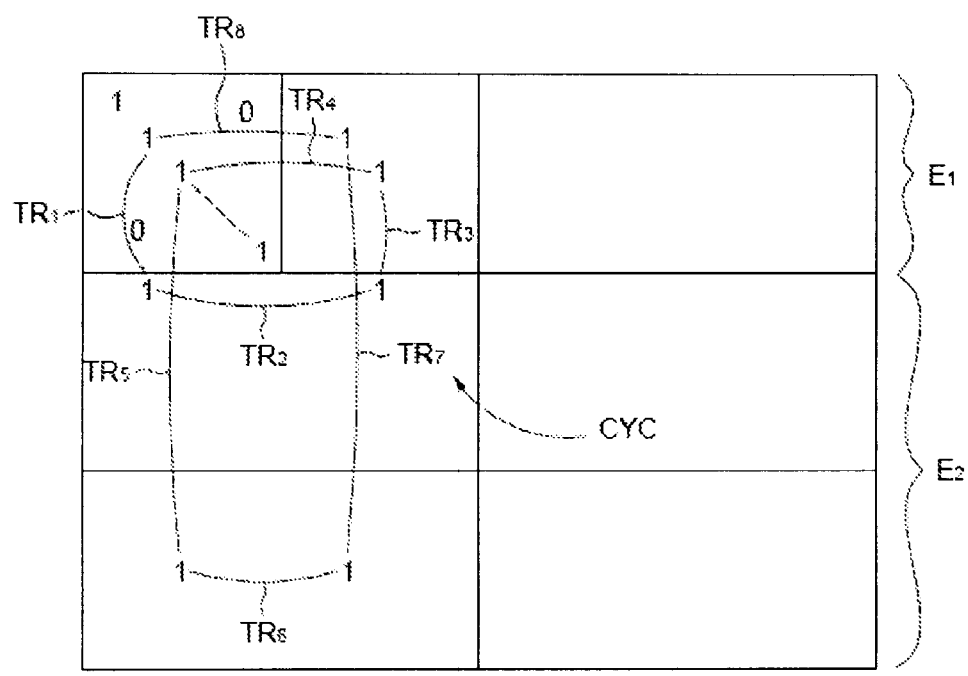

By way of example, as illustrated in FIG. 12, the cycle CYC starting from the intermediate node situated in the second column and the second row of the matrix E1 and ending up at this same node is performed as eight legs TR1-TR8. The person skilled in the art will know how to determine the desirable threshold for the graph radius as a function of the planned application and of the performance desired for the decoding. A threshold greater than or equal to 6 is an acceptable value.

It should be noted here that the subdivided-code structure which has just been described is a totally new family of code which cannot be likened to a non-binary LDPC code. Specifically, this code structure does not define a linear coding function on GF(q), stated otherwise, there does not exist any parity matrix H or generating matrix G taking its elements in GF(q), and defining the code. A code having subdivided symbols remains, however, a parity code within the customary sense on GF(2), and having a binary parity matrix image as specified above.

Figure 13:
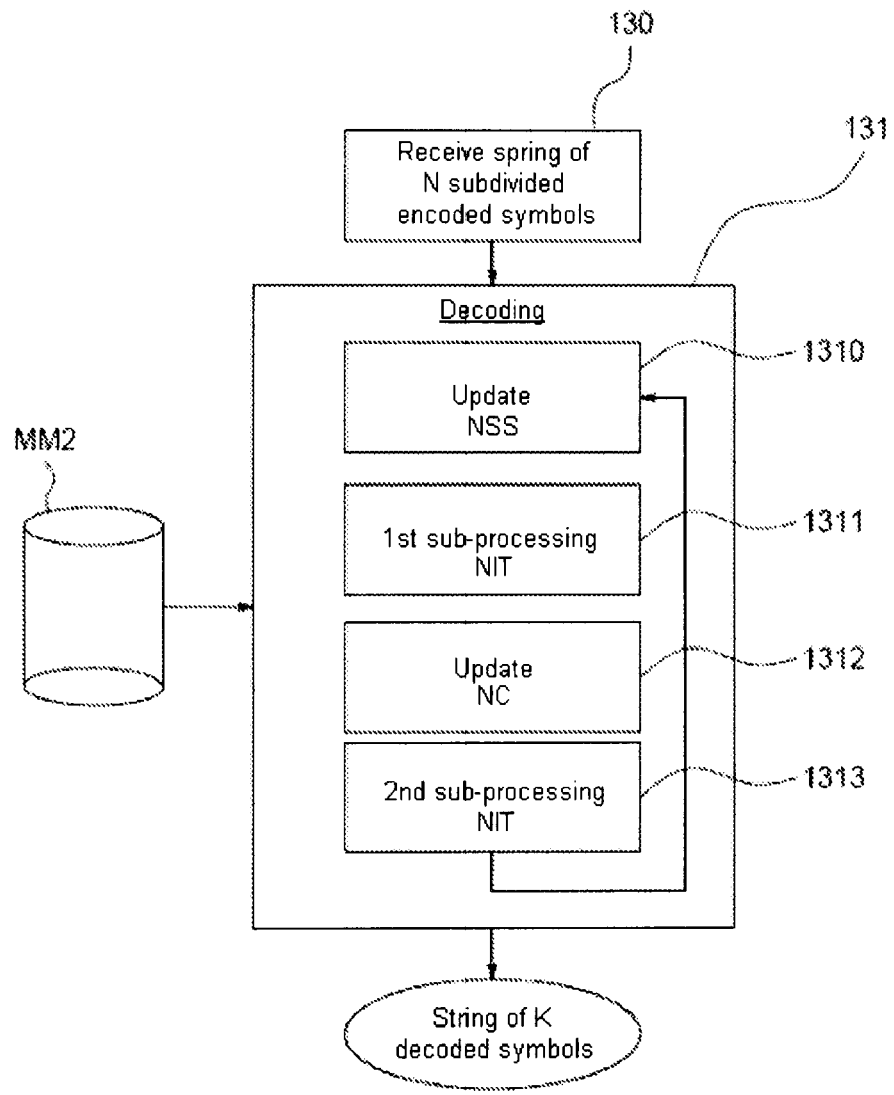
FIGS. 13 to 15 illustrate modes of implementation of a decoding of a subdivided structure code in accordance with the present invention.
Figure 14:
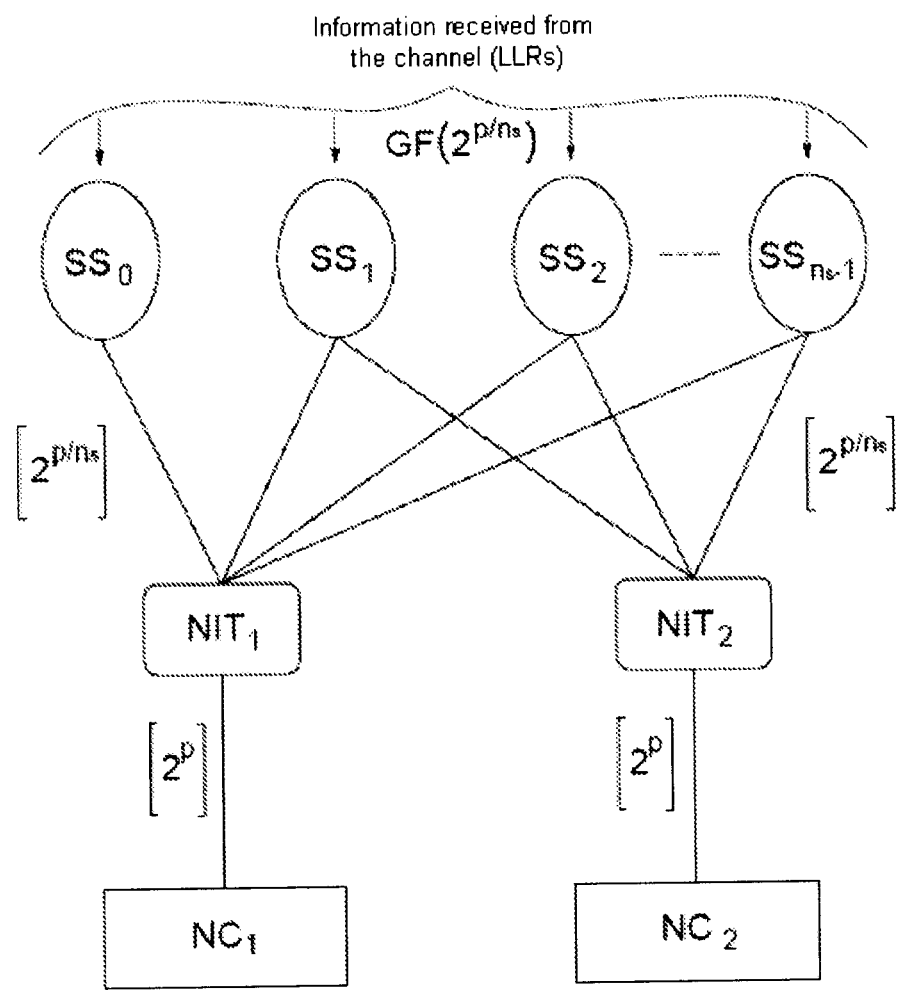
Figure 15:
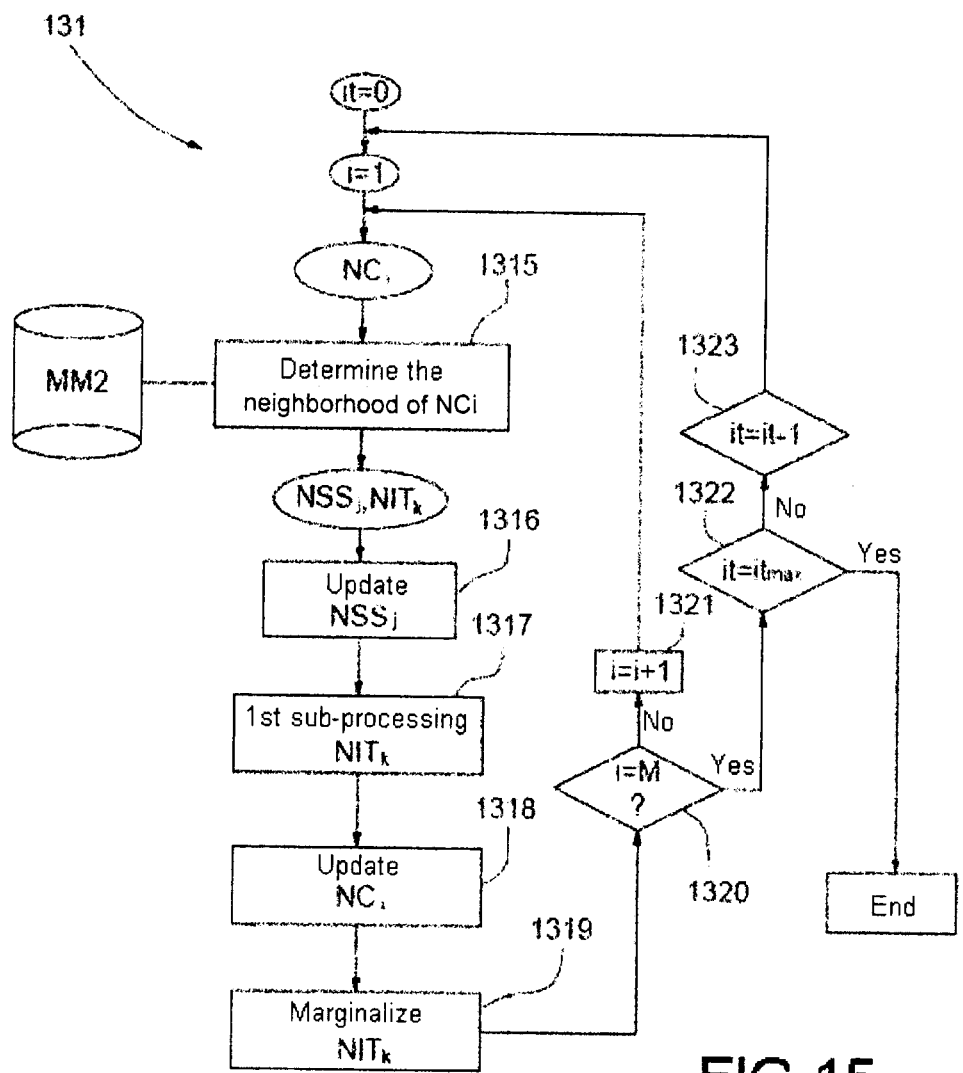

FIG. 1 is now referred to again, but in addition to FIGS. 13 to 15, to illustrate a mode of implementation of the decoding of blocks encoded with a code structure of the subdivided type. It is also still assumed for simplification purposes that q is equal to $2^p$, and each encoded symbol is able to be represented in the form of a vector of p bits, and that each symbol is subdivided into ns sub-symbols.

Referring to FIG. 1, at the output of the demodulation means or the demodulator DMDM, there is therefore obtained a string of N items of information corresponding to the N encoded symbols which have been sent on the transmission channel.

Given the real transmission conditions, each item of information is a vector of p data which are in fact probability values designated commonly by the person skilled in the art by the name LLR: Log Likelihood Ratio. In fact, the sign of the data indicates the logic value of the associated bit and the absolute value of the data indicates the degree of confidence in the logic value.

Thus, the output of the demodulation means or the demodulator DMDM delivers N vectors of LLRs representing the N encoded symbols. For simplification purposes and loosely speaking, the N vectors of LLR will be designated subsequently in the text by the expression N encoded symbols. Of course, these N encoded symbols are in fact subdivided into NI sub-symbols which will be decoded by the decoding means.

In a general manner, as illustrated in FIG. 13, the decoding 131 is undertaken after reception of the string of N subdivided encoded symbols (step 130). This decoding comprises first of all an initialization of the sub-symbol nodes with the values of the information (LLRs) received from the channel (in FIG. 14, ns=4).

In this regard, the decoder interprets the $p/n_s$ bits received from the channel as a single symbol (a sub-symbol) defined on the Galois field GF ($2^{p/ns}$). The decoding comprises the iterative exchanging of messages between these various nodes, with these messages being vectors of LLRs.

The sub-symbol nodes NSS are updated (step 1310, FIG. 13). In this regard, the size of the messages which have to be stored is reduced since this update is performed in the Galois field of order $2^{p/ns}$.

The decoding also comprises an updating of the check nodes (step 1312) performed in the Galois field of order q, as well as a processing of the intermediate nodes (steps 1311 and 1313) which is distributed before and after the updating of the check nodes.

As will be seen in greater detail below, a first sub-processing of the intermediate nodes includes a recombination of probabilities and a second sub-processing includes of a marginalization processing. This decoding is iterative as shown by the arrow referenced 1314 in FIG. 13.

After a certain number of iterations and/or the satisfaction of a decoding stopping criterion, K vectors of LLRs are obtained, whose signs will provide the logic values of the K sets of p bits corresponding to the K decoded symbols. To perform this decoding, it is possible to use an algorithm of the belief propagation type, well known to the person skilled in the art by the name BP.

An approach for performing this iterative decoding can include first updating all the sub-symbol nodes, then in performing the first sub-processing of all the intermediate nodes, then in performing an update of all the check nodes, and finally performing the marginalization processing for all the intermediate nodes.

A more effective approach includes performing a sequential updating of the nodes, an exemplary implementation of which is illustrated in FIG. 15. In FIG. 15, it denotes the number of iterations and i the index of a check node NC. For a current node $NC_i$ (step 1315) the neighborhood of the node $NC_i$, that is, the sub-symbol nodes $NSS_j$ and $NIT_k$ which are linked to this check node is determined.

This determination of the neighborhood is obtained on the basis of an indication representative of the symbols subdivision scheme, although, as has already been mentioned above, such an indication is not absolutely indispensable but eases the decoding. In this instance, this indication results, for example, from the initial matrix MIN contained in the memory MM2.

After having determined the sub-symbol nodes $NSS_j$ connected to this check node $NC_i$, an update (step 1316) of these sub-symbol nodes is performed. This update is as indicated above and performed in the Galois field of order $2^{p/ns}$.

The equations for updating such nodes in a Galois field are well known to the person skilled in the art and the latter may, for example, refer for all useful purposes to the article by David Declercq and Marc Fossorier titled "Decoding Algorithms for Nonbinary LDPC Codes over GF (q)", IEEE Trans. On Commun., vol 55(4), pp. 633-643, April 2007. It is recalled here that the update takes into account, in particular through an addition operation, the messages ending up at the sub-symbol nodes considered, except for the one originating from the check node to which this sub-symbol is indirectly linked.

The first sub-processing 1317 of the intermediate nodes NIT), connected to these updated sub-symbol nodes is performed thereafter. This first sub-processing is a processing for recombining probabilities.

Thus, the probability that the value of the intermediate node NIT is equal to $\alpha_i$ is obtained on the basis of the values β of the sub-symbol nodes by using Bayes conditional probability rules in accordance with the formula below:

$$P(NIT=\alpha_1)=P(SS_0=\beta_0, \ldots, SS_{x-1}=\beta_{x-1})P(SS_0\beta_0|SS_1=\beta_1, \ldots, SS_{X-1}=\beta_{x-1})P(SS_1=\beta_1|SS_2=\beta_2, \ldots, SS_{x-1}=\beta_{x-1}) \ldots P(SS_{x-1}=\beta_{x-1})$$

To simplify this equation, it is possible to use an assumption of independence between the sub-symbols to obtain a simpler expression defined by the formula below:

$$P(NIT=\alpha_1)=P(SS_0=\beta_0)P(SS_1=\beta_1) \ldots P(SS_{x-1}=\beta_{x-1})$$

An update of the check node $NC_i$ is performed thereafter (step 1318). This update is performed in the Galois field of order q and is an update that is conventional and well known to the person skilled in the art. The latter may also refer to the article by David Declercq mentioned above.

Finally, a second sub-processing 1319 of the intermediate nodes $NIT_k$ is performed, which is a marginalization processing in accordance with, for example, the equation with the formula below:

$$P(SS_i = \beta_i) = \sum_{SS_0=0}^{GF(2^{p/ns})-1} \ldots$$

-continued $$\sum_{SS_j=0, j\neq i}^{GF(2^{p/ns})-1} \ldots \sum_{SS_{ns-1}=0}^{GF(2^{p/ns})-1} P(A \mid S_i = \beta_i, SS_0, \ldots, SS_j, \ldots SS_{ns-1}) \times$$

$$P(SS_0 = \beta_0) \ldots P(SS_j = \beta_j) \ldots P(SS_{ns-1} = \beta_{ns-1})$$

wherein the mutual independence of the sub-symbols has again be assumed.

Then, we go to the next check node and the operations which have just been described are repeated. When i is equal to M, that is, when all the check nodes have been processed, the iteration counter is incremented (step 1323) and the steps which have just been described are repeated. When the number of iterations is equal to the maximum number of iterations predefined ITmax (step 1322), the decoding algorithm is terminated. Of course, this stopping criteria is only an example, and any other conventional stopping criterion is appropriate.

Figure 16:
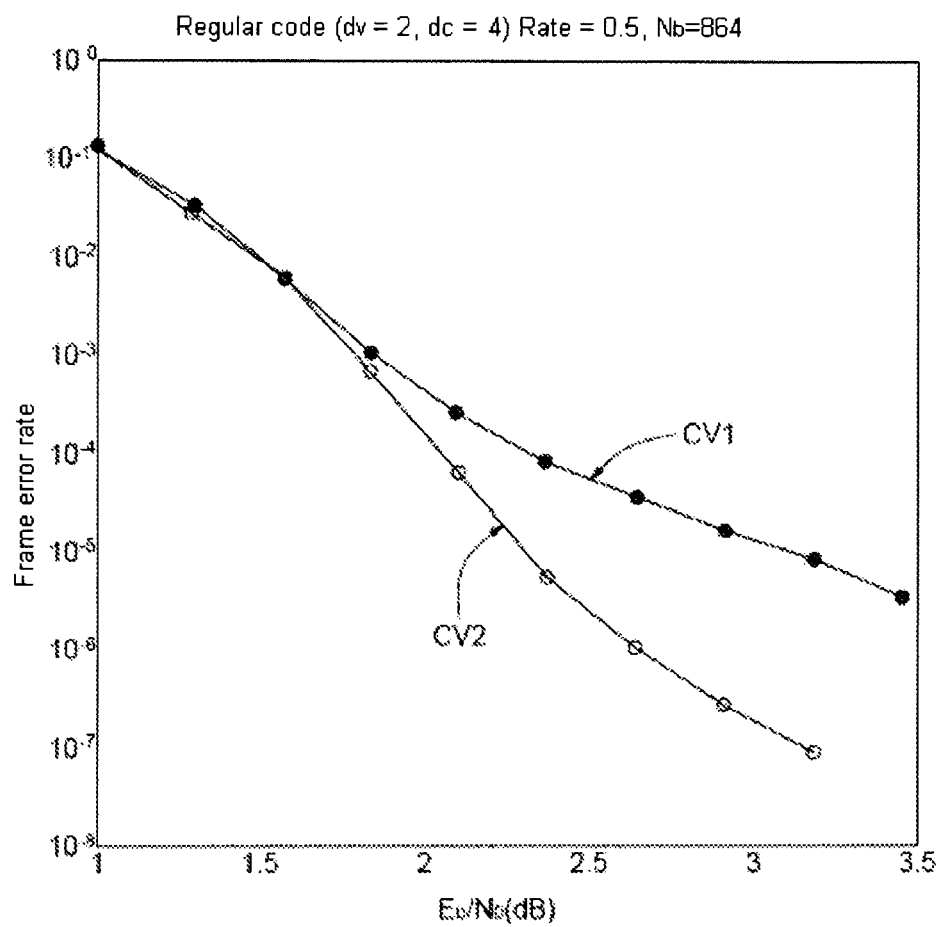
FIGS. 16 and 17 illustrate examples of decoding performance using examples of subdivided-code structures in accordance with the present invention.
Figure 17:
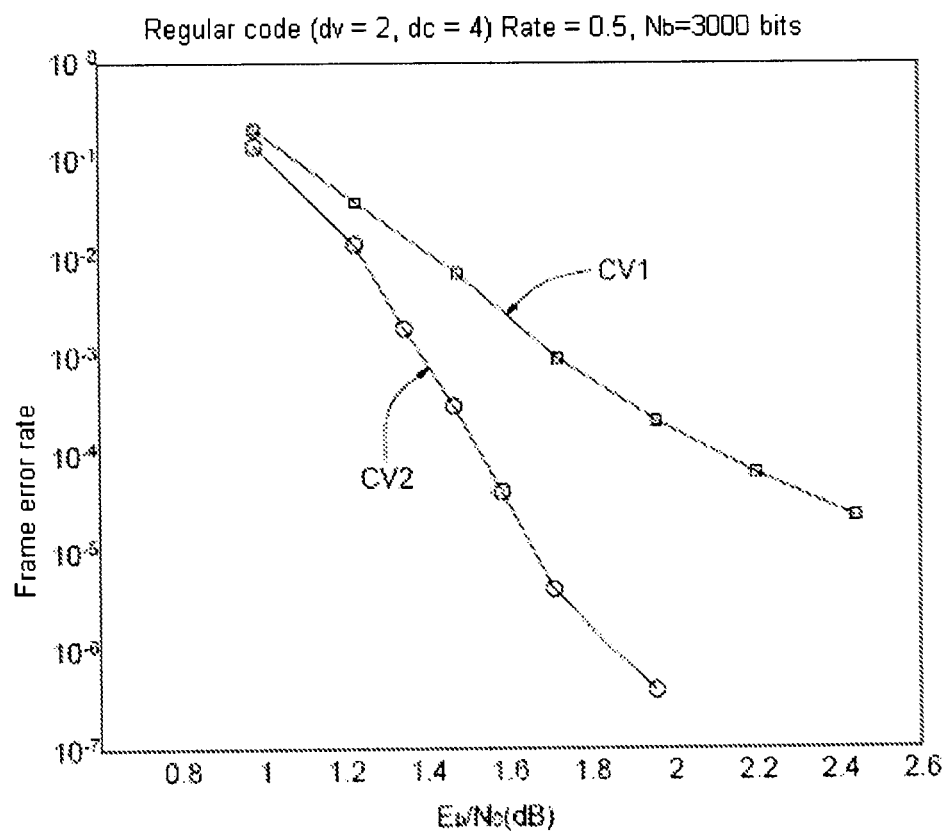

FIGS. 16 and 17 illustrate curves showing certain advantages of the disclosed modes of implementation. On the basis of a quasi-cyclic construction, a structure of codes of the subdivided type has been formulated with the following parameters: code rate R=0.5, $d_v$=2, $d_c$=4.

The check nodes are defined on the Galois field of order q=64 ($2^6$) and all the symbols are subdivided into two sub-symbols of bit size 3 (ns=2). In FIG. 16, the total number of bits of the initial string of symbols is equal to $N_b$=864.

A maximum of 1000 iterations has been fixed and the decoder has been halted by using a conventional criteria of the syndrome type, well known to the person skilled in the art. In FIG. 17, the same parameters have been used but $N_b$=3000 bits.

In FIGS. 16 and 17, the ordinate axis represents the frame error rate while the abscissa axis represents $E_b/N_0$ with $E_b$ representing the mean energy of transmission of a bit on the channel and $N_0$ is the noise energy of the channel. The curve CV1 represents the performance of a conventional LDPC code on GF(64) while the curve CV2 shows the performance for a code with a subdivided structure. It is therefore noted that the code with the subdivided structure exhibits a much lower error floor.

The invention claimed is:

1. A method for encoding a string of K initial symbols with a code of a parity check type, the method comprising:
   receiving the string of K initial symbols belonging to a Galois field of order q greater than 2;
   storing code characteristics for the code, the code characteristics being represented by a graph comprising N-K first nodes, with each node satisfying a parity check equation defined on the Galois field, N packets of intermediate nodes and NI second nodes, and with each intermediate node being linked to a single first node and to a plurality of second nodes by a connection scheme; and
   encoding the string of K initial symbols by using the code characteristics to obtain a string of N encoded symbols, the N encoded symbols being subdivided into NI encoded sub-symbols belonging respectively to mathematical sets whose orders are less than q, according to a subdivision scheme representative of the connection scheme.

2. The method according to claim 1, wherein the N packets of intermediate nodes are respectively associated with the N encoded symbols, the subdivision scheme representative of the connection scheme comprising, for each encoded symbol, the number and locations of the corresponding sub-symbols within the string, the number and locations being representative of a part of the connection scheme ending up at the packet of intermediate nodes associated with the encoded symbols.

3. The method according to claim 1, wherein q is equal to $2^p$, with p being greater than 1 and each order less than q is also an integer power of 2, and defining the code characteristics comprises:
   forming a first matrix including N-K groups of rows respectively associated with N-K parity check equations and N groups of p columns respectively associated with the N symbols, each group of p rows comprising bit blocks of p rows and of p columns forming respectively binary matrix images of nonzero coefficients of the parity check equation associated with the group of p rows being considered;
   each of these bit blocks, associated with a symbol, being subdivided into j bit sub-blocks of p rows and of $p_i$ columns respectively situated at different locations on the group of p rows, and for values of the numbers j and $p_i$, i varies from 1 to j; and
   positions of the locations of the sub-blocks forming a block associated with an encoded symbol being representative of part of the subdivision scheme associated with the encoded symbol, and with the string of encoded symbols being obtained based on the first matrix and the string of K initial symbols;
   the encoding comprises forming the string of encoded symbols based on the first matrix.

4. The method according to claim 3, wherein forming the first matrix comprises forming an initial matrix comprising a first part representative of the parity check equations, and a second part containing grouping indications respectively representative of the subdivision scheme.

5. The method according to claim 4, wherein the first part of the initial matrix comprises N-K rows whose elements belonging to the Galois field are representative of the coefficients of the parity check equations, and the second part of the initial matrix comprises NI rows respectively associated with the NI second nodes and whose elements form the grouping indications, with the first part and the second part of the initial matrix having a same number of columns, and with this number being equal to the number of intermediate nodes.

6. The method according to claim 5, wherein the second part of the initial matrix is formed to obtain for the initial matrix a graph radius greater than or equal to a threshold.

7. The method according to claim 6, wherein the threshold is equal to 6.

8. The method according to claim 1, wherein the mathematical sets having an order less than q all exhibit the same order.

9. The method according to claim 1, wherein the mathematical sets comprise Galois fields.

10. The method according to claim 3, wherein the mathematical sets having an order less than q all exhibit the same order; and wherein each order less than $2^p$ is equal to $2^{p/ns}$, and NI is equal to a product of ns times N.

11. The method according to claim 1, further comprising providing an indication representative of the subdivision scheme that is representative of the connection scheme.

12. An encoding device comprising:
   an input for receiving a string of K initial symbols belonging to a Galois field of order q greater than 2;
   a memory for storing code characteristics that are represented by a graph comprising N-K first nodes, with each node satisfying a parity check equation defined on the Galois field, N packets of intermediate nodes and NI second nodes, and with each intermediate node being linked to a single first node and to a plurality of second nodes by a connection scheme; and an encoder coupled to said input and to said memory for encoding the string of K initial symbols by using the code characteristics to obtain a string of N encoded symbols, the N encoded symbols being subdivided into NI encoded sub-symbols belonging respectively to mathematical sets whose orders are less than q, according to a subdivision scheme representative of the connection scheme.

13. The encoding device according to claim 12, wherein the N packets of intermediate nodes are respectively associated with the N encoded symbols, the subdivision scheme representative of the connection scheme comprising, for each encoded symbol, the number and locations of the corresponding sub-symbols within the string, the number and locations being representative of a part of the connection scheme ending up at the packet of intermediate nodes associated with the encoded symbols.

14. The encoding device according to claim 12, wherein q is equal to $2^p$, with p being greater than 1 and each order less than q is also an integer power of 2, and further comprising a processor for defining the code characteristics based on the following:

forming a first matrix including N-K groups of rows respectively associated with N-K parity check equations and N groups of p columns respectively associated with the N symbols, each group of p rows comprising bit blocks of p rows and of p columns forming respectively binary matrix images of nonzero coefficients of the parity check equation associated with the group of p rows being considered;

each of these bit blocks, associated with a symbol, being subdivided into j bit sub-blocks of p rows and of $p_i$ columns respectively situated at different locations on the group of p rows, and for values of the numbers j and $p_i$, i varies from 1 to j; and positions of the locations of the sub-blocks forming a block associated with an encoded symbol being representative of part of the subdivision scheme associated with the encoded symbol, and with the string of encoded symbols being obtained based on the first matrix and the string of K initial symbols;

said encoder forming the string of encoded symbols based on the first matrix.

15. The encoding device according to claim 14, wherein said processor is configured for forming an initial matrix when forming the first matrix, the initial matrix comprising a first part representative of the parity check equations, and a second part containing grouping indications respectively representative of the subdivision scheme.

16. The encoding device according to claim 15, wherein the first part of the initial matrix comprises N-K rows whose elements belonging to the Galois field are representative of the coefficients of the parity check equations, and the second part of the initial matrix comprises NI rows respectively associated with the NI second nodes and whose elements form the grouping indications, with the first part and the second part of the initial matrix having a same number of columns, and with this number being equal to the number of intermediate nodes.

17. The encoding device according to claim 16, wherein the second part of the initial matrix is formed to obtain for the initial matrix a graph radius greater than or equal to a threshold.

18. The encoding device according to claim 12, wherein said encoder provides an indication representative of the subdivision scheme that is representative of the connection scheme.

19. A method for decoding a string of encoded symbols, in which each symbol has been encoded with a code of a parity check type defined by code characteristics, the method comprising:

receiving the string of encoded symbols, each encoded symbol of the string belonging to a Galois field of order q greater than 2 and being subdivided into sub-symbols belonging respectively to mathematical sets of orders less than q, according to a subdivision scheme;

storing characteristics of the code that are represented by a graph comprising first nodes each satisfying a parity equation, second nodes and intermediate nodes, with each intermediate node being linked to a single first node and to several second nodes by a connection scheme representative of the subdivision scheme; and decoding the string of encoded symbols by performing an iterative update of the first nodes in the Galois field, and by performing an iterative update of the second nodes in the mathematical sets of orders less than q, taking account of the subdivision scheme.

20. The method according to claim 19, further comprising processing the intermediate nodes, with the intermediate nodes being distributed before and after an update of the first nodes.

21. The method according to claim 19, wherein the iterative update of the nodes comprises a sequential update of the first nodes and of the nodes in a neighborhood of each updated first node.

22. The method according to claim 19, wherein the updates are performed using an algorithm of the belief propagation type.

23. The method according to claim 19, wherein q is equal to $2^p$, with p greater than 1 and each order less than q is also an integer power of 2.

24. The method according to claim 19, wherein the mathematical sets having an order less than q all exhibit a same order.

25. The method according to claim 19, wherein the mathematical sets having an order less than q comprise Galois fields.

26. The method according to claim 23, wherein the mathematical sets having an order less than q all exhibit a same order, and with each order less than $2^p$ being equal to $2^{p/ns}$.

27. The method according to claim 19, wherein the code characteristics corresponding to the graph are stored in matrix form.

28. The method according to claim 27, wherein coefficients of the parity equations as well as information representative of the scheme for subdividing the symbols into sub-symbols within the string are stored in matrix form.

29. The method according to claim 28, wherein the matrix comprises a first part representative of the parity check equations, and a second part containing various grouping indications respectively representative of the subdivisions of the encoded symbols.

30. The method according to claim 29, wherein a string of N encoded symbols is received; and a string of K decoded symbols is delivered and the first part of the matrix comprises N-K rows whose elements belonging to the Galois field are representative of the coefficients of the various parity check equations, and the second part of the matrix comprises NI rows, respectively associated with the NI second nodes, whose elements form the grouping indications, and the first part and the second part of the matrix have the same number of columns, with this number being equal to the number of intermediate nodes.

31. A decoding device comprising:
- an input for receiving a string of symbols encoded with a code of a parity check type, each encoded symbol of the string belongs to a Galois field of order q greater than 2 and being subdivided into sub-symbols belonging respectively to mathematical sets of orders less than q, according to a subdivision scheme;
- a memory for storing characteristics of the code that are represented by a graph comprising first nodes each satisfying a parity equation, second nodes and intermediate nodes, each intermediate node being linked to a single first node and to several second nodes by a connection scheme representative of the subdivision scheme; and
- a decoder coupled to the said input and to said memory for performing an iterative update of the first nodes in the Galois field, and for performing an iterative update of the second nodes in the mathematical sets of orders less than q, taking account of the subdivision scheme.

32. The decoding device according to claim 31, wherein said decoder is further configured to process the intermediate nodes that are distributed before and after an update of the first nodes.

33. The decoding device according to claim 31, wherein said decoder is further configured to update in a sequential manner the first nodes, and the nodes in a neighborhood of each first node intended to be updated.

34. The decoding device according to claim 31, wherein said decoder is further configured to implement an algorithm of the belief propagation type.

35. The decoding device according to claim 31, wherein q is equal to $2^p$, with p greater than 1 and each order less than q is also an integer power of 2.

36. The decoding device according to claim 31, wherein said memory stores in matrix form the code characteristics corresponding to the graph.

37. The decoding device according to claim 36, wherein the matrix contains coefficients of the parity equations as well as information representative of the scheme for subdividing the symbols into sub-symbols within the string.

38. The decoding device according to claim 37, in which the matrix comprises a first part representative of the parity check equations, and a second part containing various grouping indications respectively representative of the subdivisions of the various encoded symbols.

39. The decoding device according to claim 38, wherein the first part of the matrix comprises N-K rows whose elements belonging to the Galois field are representative of the coefficients of the parity check equations, and the second part of the matrix comprises NI rows, respectively associated with the NI second nodes, whose elements form the grouping indications, and with the first part and the second part of the matrix having a same number of columns, with this number being equal to the number of intermediate nodes; and said input receiving a string of N encoded symbols, and said decoder to deliver a string of K symbols decoded based on the matrix and the string of N symbols.

* * * * *